(12) United States Patent
Gliese et al.

(10) Patent No.: US 7,199,618 B2
(45) Date of Patent: Apr. 3, 2007

(54) LOGIC CIRCUIT ARRANGEMENT

(75) Inventors: Jörg Gliese, Munich (DE); Michael Scheppler, Grobenzell (DE)

(73) Assignee: Infineon Technologies AG, Munich (DE)

( * ) Notice: Subject to any disclaimer, the term of this patent is extended or adjusted under 35 U.S.C. 154(b) by 222 days.

(21) Appl. No.: 10/996,620

(22) Filed: Nov. 19, 2004

(65) Prior Publication Data

US 2005/0134317 A1 Jun. 23, 2005

(30) Foreign Application Priority Data

Nov. 21, 2003 (DE) ................. 103 54 501

(51) Int. Cl.
*H03K 19/096* (2006.01)
(52) U.S. Cl. .................. 326/98; 326/104; 326/106
(58) Field of Classification Search ................ 326/98, 326/95
See application file for complete search history.

(56) References Cited

U.S. PATENT DOCUMENTS 5,883,525 A * 3/1999 Tavana et al. ............... 326/39
5,917,758 A * 6/1999 Keeth ..................... 365/189.05
6,097,222 A * 8/2000 Lovett ........................ 326/121
6,285,218 B1 9/2001 Dhong et al.
6,512,397 B1 * 1/2003 Jacobson et al. ........... 326/121
6,529,040 B1 3/2003 Carberry et al.
6,642,743 B2 * 11/2003 Bal .............................. 326/37
2005/0140389 A1 * 6/2005 Gliese et al. ................. 326/41

FOREIGN PATENT DOCUMENTS

DE 31 48 410 A1 11/1982
EP 0 573 175 A2 12/1993

OTHER PUBLICATIONS

Wannemacher, M "Das FPGA-Kochbuch", Abb. 6.4: SRAM-Zelle von XILINX, 1. Auflage, International Thomson Publishing Company, Bonn, 1998, p. 111, no date.
Wannemacher, M "Das FPGA-Kochbuch", Abb. 7.36: Logikblock (CLB) der XC4000-Familien, 1. Auflage, International Thomson Publishing Company, Bonn, 1998, p. 197, no date.

* cited by examiner

*Primary Examiner*—Vibol Tan
(74) *Attorney, Agent, or Firm*—Dickstein, Shapiro, LLP.

(57) ABSTRACT

A logic circuit arrangement including at least two data signal inputs, at which at least two data signals are provided, a first signal path coupled to the data signal inputs, and having a plurality of transistors of a first conduction type, and a plurality of control inputs coupled to the transistors.

22 Claims, 7 Drawing Sheets

| $c_3$ | $c_2$ | $c_1$ | $c_0$ | y |
|---|---|---|---|---|
| 0 | 0 | 0 | 0 | 0 |
| 0 | 0 | 0 | 1 | $a_0 \wedge a_1$ [AND] |
| 0 | 0 | 1 | 0 | $\overline{a_0} \wedge a_1$ |
| 0 | 0 | 1 | 1 | $a_1$ |
| 0 | 1 | 0 | 0 | $a_0 \wedge \overline{a_1}$ |
| 0 | 1 | 0 | 1 | $a_0$ |
| 0 | 1 | 1 | 0 | $a_0 \oplus a_1$ [XOR] |
| 0 | 1 | 1 | 1 | $a_0 \vee a_1$ [OR] |
| 1 | 0 | 0 | 0 | $\overline{a_0 \vee a_1}$ [NOR] |
| 1 | 0 | 0 | 1 | $\overline{a_0 \oplus a_1}$ [XNOR] |
| 1 | 0 | 1 | 0 | $\overline{a_0}$ |
| 1 | 0 | 1 | 1 | $\overline{a_0} \vee a_1$ |
| 1 | 1 | 0 | 0 | $\overline{a_1}$ |
| 1 | 1 | 0 | 1 | $a_0 \vee \overline{a_1}$ |
| 1 | 1 | 1 | 0 | $\overline{a_0 \wedge a_1}$ [NAND] |
| 1 | 1 | 1 | 1 | 1 |

LOGIC CIRCUIT ARRANGEMENT

CROSS REFERENCE TO RELATED APPLICATIONS

This application claims priority from German Application No. 103 54 501.8, filed in on Nov. 21, 2003.

FIELD OF THE INVENTION

The invention relates to a logic circuit arrangement.

BACKGROUND OF THE INVENTION

The advent of digital technology and the rapid development of microprocessor technology gave rise to a demand for programmable logic. PLDs ("programmable logical devices") are integrated circuits whose logic function is defined by the user by means of programming. A PLD is a regularly constructed architecture for digital logic operations with a multiplicity of switches that enable a multiplicity of signal paths. The logic function assigned to a PLD in a user-specific fashion is defined by means of the configuration of the PLD.

PLDs include, inter alia, field-programmable gate arrays (FPGA), the functionality of which can be assigned to them by the user, mask-programmable gate arrays (MPGA, also called "structured ASICs"), which can be allocated a logic function by means of hardware configuration. Via-programmable gate arrays (VPGAs) belong among MPGAs.

A digital logic cell maps n input signals onto an output signal. The number of possible mapping functions is $2^{2^n}$. Such a circuit group is realized in accordance with the prior art by using so-called look-up tables (LUT), for example. For this purpose, function values of the logic function are set by means of a data word of $2^{2^n}$ bits. In other words, the respectively selected logic function is coded in the data word. The n input signals $a_0, a_1, \ldots a_{n-1}$ are combined with one another in accordance with the selected logic function. Consequently, the logic input signals of the logic function $y=f(a_0, a_1, \ldots, a_{n-1})$ may be regarded as a binary address. The logic input signals are converted into a so-called one-hot coding and a function value is subsequently selected by means of a pass gate logic. A method of this type is known, for example, from Wannemacher, M "Das FPGA-Kochbuch" ["The FPGA cook book"], FIG. 6.4: SRAM cell from XILINX, 1st Edition, International Thomson Publishing Company, Bonn, 1998, p. 111.

In accordance with Wannemacher, M "Das FPGA-Kochbuch" ["The FPGA cook book"], FIG. 7.36: Logic block (CLB) of the XC4000 families, 1st Edition, International Thomson Publishing Company, Bonn, 1998, p. 197, the inputs may serve as control inputs for a multiplexer tree. The multiplexers may be realized in a logic-based manner and/or on the basis of transmission gates.

U.S. Pat. No. 6,529,040 B1 discloses an FPGA on the basis of a look-up table (LUT). In accordance with U.S. Pat. No. 6,529,040 B1, a logic function is only selected by combination of the value of input signals (IN1, IN2, . . . ) with logic selection signals (Q1, Q2 . . . ). To put it another way, in accordance with U.S. Pat. No. 6,529,040 B1, a logic function can be selected by means of applying the input signals and the logic selection signals to transistor inputs of a multiplexer.

The solutions using a look-up table which are disclosed in the prior art have disadvantages with regard to switching speed and/or interference immunity. The known solutions furthermore cannot be realized sufficiently compactly in terms of layout for many applications. Therefore, continued scaling is possible only with difficulty using the LUT solutions disclosed in the prior art.

As an alternative to the known LUT architectures, the prior art discloses interconnections comprising individual logic gates which can be used to construct a desired logic function. However, such an architecture is restricted to the formation of a very specific logic function, whereas the overall scope of all possible logic mapping functions is very complicated to realize using predetermined logic gates. The complicated logic gates are in need of improvement with regard to the achievable switching speed, too. The limitation of the scope of possible logic functions considerably complicates the automatic logic partitioning in the case of an FPGA design.

Furthermore, European Patent Application Publication Number 0 573 175 A2 describes a programmable logic cell having two inputs and six outputs, each of the outputs providing a logic function of the signals present at the two inputs which differs from those at the other outputs. Each output is generated by means of a pair of NMOS field effect transistors, a respective logic function being provided by coupling the gate terminals of the two NMOS field effect transistors to the signals present at the two inputs or their inverted signals, said logic function being selected by means of a 6:1 multiplexer.

U.S. Pat. No. 6,285,218 B1 describes a method and a device for implementing logic using mask-programmable dynamic logic gates.

DE 31 48 410 C2 discloses a programmable combination circuit having a complementarily symmetrical MOS field effect transistor arrangement, network connections of the channels of the MOS field effect transistor pairs being modified by suitably arranged channels of field effect transistors with a programmable threshold voltage, the field effect transistors with a programmable threshold voltage being switched into their conducting or nonconducting state, in a programming step, by application of programming voltages between their gate and channel end. These field effect transistors remain in their conducting or nonconducting state until renewed programming and thus control the logic response behaviour of the combination circuit formed.

SUMMARY OF THE INVENTION

The invention is based on the problem, in particular, of providing a logic circuit arrangement with an alternative architecture.

The problem is solved by means of a logic circuit arrangement having the features in accordance with the independent patent claim.

The logic circuit arrangement according to the invention contains at least two data signal inputs, at which at least two data signals can be provided. Furthermore, the logic circuit arrangement has a first signal path having a plurality of transistors of a first conduction type, said signal path being coupled to the data signal inputs, it being possible for the transistors to be connected up to one another in such a way that they realize a first logic function from all possible logic functions for the logic combination of the two data signals, so that an output signal representing the result of the first logic function is provided. Furthermore, the logic circuit arrangement has a plurality of control inputs coupled to the transistors, by means of which a predeterminable signal propagation path formed by the transistors can be connected in or disconnected.

One basic idea of the invention consists in providing a universally configurable logic cell by means of which data signals that can be provided at the data signal inputs can be combined with one another in accordance with a predeterminable logic function. This logic function is a very specific logic function which can be selected from all conceivable logic functions for the combination of the data signals. In other words, the logic function which is realized may be any possible logic combination of the data signals. The logic function that is respectively to be implemented can be defined by means of the fixedly or variably predeterminable interconnection of the transistors in the first signal path. For this purpose, corresponding electrical signals are applied to the control inputs of the logic circuit arrangement. Said signals may be, by way of example, variable signals which drive the transistors in such a way that a desired signal propagation path formed by the transistors is connected in or disconnected, precisely the desired logic function being assigned to the signal propagation path selected in this way (which clearly corresponds to the propagation distance of the data signals through the arrangement of transistors connected up to one another). When variable signals coordinated with a specific logic function are applied to the control inputs, clearly a turn-off/turn-on of the transistors is set, as a result of which only specific signal propagation paths are enabled whereas others are not. As an alternative, the transistors can be connected up to one another in an invariable manner in terms of hardware, as a result of which permitted signal propagation paths and, consequently, a specific logic function are fixedly predetermined. By way of example, an electrical supply voltage potential or an electrical ground potential can then be provided at the control inputs. To put it another way, it is possible, by way of example, to apply variable logic function signals by means of predetermining logic function signals at the control inputs of the transistors. As an alternative, the logic may be realized in a hardwired or invariable manner by virtue of the fact that, on account of the interconnection of the transistors (e.g. by means of short-circuiting individual transistors), transistor control terminals are allocated fixedly predetermined electrical potentials in which a fixedly allocated logic function is coded.

The architecture according to the invention requires neither look-up tables nor gate sequences for the realization of the logic basic functions. With the transistor network according to the invention which is formed from the signal path of transistors, it is possible to realize any desired logic function of all the possible logic functions for the respective number of input signals by means of predetermining the interconnection of the transistors.

Consequently, a new architecture of a universally configurable logic cell is produced, which is suitable in particular for use in PLDs, and further in particular for use in FPGAs or MPGAs. With the realization according to the invention, a small required chip area for realizing the logic operations is combined with a very low power loss and a high switching speed. The logic circuit arrangement according to the invention has high interference immunity and is suitable for flexible scaling for an arbitrary number of inputs and outputs. A particularly space-saving and fast logic architecture is achieved with the use of precisely one signal path of transistors.

In contrast to the LUT architectures disclosed in the prior art, it is not absolutely necessary in the case of the invention for the for example $2^n$ function values that are necessary for selecting a logic function to be stored in an externally provided memory cell. Compared with the static LUT principle, the invention has significantly increased flexibility since it enables a logic function to be predetermined in a user-defined or variable manner by means of the provision of signals at the control inputs of the logic circuit arrangement. However, it is possible according to the invention, as an alternative, to fixedly predetermine a desired logic function for a logic circuit arrangement in a specific application scenario, for example by means of fixedly predetermined interconnection of the transistors or by means of the application of fixedly predetermined electrical potentials to the different control terminals of the transistors of the signal path, which transistors can be driven by means of the control inputs of the logic circuit arrangement. Directly predetermining a desired logic function by means of corresponding control of the transistors of the signal paths increases the interference immunity compared with the LUT solution.

In a configuration of the logic circuit arrangement according to the invention with a variable logic that is set by means of predetermining logic function signals, the logic circuit arrangement is suitable as an FPGA. In an implementation of the logic circuit arrangement according to the invention as a structured ASIC (structured application-specific integrated circuit) or as a mask-programmable gate array (MPGA), by contrast, the logic function of the logic circuit arrangement is fixedly set, for example by means of the fixedly predetermined interconnection of different transistors using vias. As a result, it is possible to produce a logic chip with a low outlay, only a very small number of expensive masks being required.

The logic circuit arrangement according to the invention enables a desired logic function with a circuitry outlay that is significantly reduced compared with the realization by means of individual gates in accordance with the prior art.

It should be noted that, according to the invention, a desired logic function can be selected solely by means of predetermining signals at the control terminals, whereas the data signals that can be provided at the data signal inputs preferably have no influence whatsoever on the selected logic function. This significantly differentiates the solution according to the invention from the FPGA disclosed in U.S. Pat. No. 6,529,040 B1, in which specific data paths in a multiplexer are only set by the interaction of data signals and additional other signals, whereby the desired logic function is selected.

The logic circuit arrangement according to the invention has at least two data signal inputs. A larger number of data signal inputs, for example three, four, five or more data signal inputs, are often provided for typical application situations.

Preferred developments of the invention emerge from the dependent claims.

The logic circuit arrangement may have an evaluation switch and a precharge switch, which switches are connected up and can be controlled in such a way that the output signal is provided at an output of the logic circuit arrangement when the evaluation switch is open (and the precharge switch is simultaneously closed), and that a reference signal (for example the supply voltage or the ground potential) is provided at the output of the logic circuit arrangement when the precharge switch is open (and the evaluation switch is simultaneously closed).

In accordance with this configuration, the output can be precharged to the reference potential by means of the precharge switch (precharge phase), for example during the first half of a switching period of the logic circuit arrangement. By means of the evaluation switch, the output signal processed in accordance with the predetermined logic function can be provided at the output, for example during the second half of the switching period of the logic circuit arrangement (evaluate phase).

The evaluation switch and the precharge switch may in each case be transistors, for example field effect transistors or bipolar transistors.

In accordance with another configuration of the logic circuit arrangement, a second signal path having a plurality of transistors of a second conduction type complementary with respect to the first conduction type is provided, said signal path being coupled to the data signal inputs. The transistors can be connected up to one another in such a way that they realize a second logic function from all possible logic functions for the logic combination of the two data signals, so that an output signal representing the result of the second logic function is provided. The result of the second logic function is the inverse of the result of the first logic function.

By way of example, the transistors of the first conduction type may be provided as n-channel transistor and the transistors of the second conduction type may be provided as p-channel transistors, or vice versa.

Consequently, a CMOS-like realization of the logic circuit arrangement is clearly produced.

Mathematically, the product terms of a logic function which result from the Boolean logic can be constructed as series paths of p-channel transistors or n-channel transistors. Respective mutually exclusive product terms can be combined using a switch. The logic circuit arrangement according to the invention is distinguished by high interference immunity. Using $2^n$ switches, e.g. transistor, any of $2^{2^n}$ possible logic functions can be set in a user-defined or application-specific manner.

At least a portion of the first and/or of the second transistors may be formed as field effect transistors or bipolar transistors. The transistors are realized for example in silicon technology or using III-V semiconductors. The transistors may be formed in bulk silicon technology or in SOI technology ("silicon-on-insulator"), as Fin-FET transistors or as MOSFETs.

The first conduction type of the transistors may be the p conduction type and the second conduction type may be the n conduction type. As an alternative, the first conduction type may be the n conduction type and the second conduction type may be the p conduction type. However, the conduction types of the transistors in the two signal paths are in each case inverse or complementary with respect to one another.

The circuit arrangement may be set up as a CMOS circuit arrangement.

The circuit arrangement of the invention may be provided as an application-specific integrated circuit (ASIC). In particular, the circuit arrangement may be provided as a programmable logic device (PLD), as a field-programmable gate array (FPGA) or as a mask-programmed application-specific integrated circuit.

The plurality of logic functions which can be realized with the logic circuit arrangement according to the invention preferably enable at least one of the following logic operations: AND combination, OR combination, NAND combination, NOR combination, exclusive-OR combination, exclusive-NOR combination.

The logic circuit arrangement according to the invention is preferably set up in such a way that any logic operation that is possible with regard to the combination of a predetermined number of input signals can be realized by means of associated configuration.

In the case of at least a portion of the transistors, at least one logic function signal for predetermining the first or second logic function may be predetermined in an invariable or unalterable manner. In the case of this alternative, the logic operation that can be implemented by the logic circuit arrangement is clearly fixedly preset, for example by means of providing fixed electrical potentials to control inputs of transistors of the signal paths or by means of corresponding interconnection of the transistors using assigned electrical contact-making elements. To put it another way, the fixed presetting can be realized in terms of hardware.

In the case of the configuration of the logic circuit arrangement with an invariably predetermined logic function or logic operation, at least a portion of the transistors may be coupled to a storage device in which the values of the at least one logic function signal are stored. The values of the electrical potentials to be applied to the control inputs of the transistors are coded (preferably in digital fashion, that is to say by means of logic values "1" or "0") in such a storage device. Therefore, the information contained in the storage device clearly defines the logic function which is realized by the logic circuit arrangement.

As an alternative, at least one logic function signal for predetermining the first and second logic functions may be predetermined in a variable manner for at least a portion of the transistors. In the case of this configuration of the logic circuit arrangement, the latter can implement any desired logic function which is predetermined for the circuit arrangement by means of a potential that is variable (for example with respect to time) at the control inputs of the transistors. In this scenario, the logic circuit arrangement may be connected up as a variable logic cell in a superordinate circuit, which enables flexible circuit architectures. To put it another way, a logic cell of the invention may be embedded in a complex circuit and fulfil a logic subtask in the latter in the context of an overall functionality, in which case the logic subtask fulfilled by the logic cell may be changed or set anew as required by means of predetermining potentials at transistors.

The data signals, output signals and logic function signals are preferably digital signals, each of which can assume a logic value "1" or "0".

A device for generating the logically complementary data signal with respect to a respective data signal may be arranged between the at least two data signal inputs, on the one hand, and the first signal paths and the second signal paths, on the other hand. In accordance with this configuration, a logically inverse or complementary data signal with respect to a data signal can be generated and provided to the first or second signal paths. Such a device may have an assigned inverter subcircuit for each of the data signals, which inverter subcircuit may be realized for example by means of a p-MOS transistor and an n-MOS transistor.

An output signal further processing device may be connected downstream of the first signal paths and the second signal paths. Said device may serve for the further processing of the output signal generated by the logic circuit arrangement in accordance with the assigned logic functions.

Said output signal further processing device may have an inverter for the case of at least two data signal inputs. Said inverter or inverter circuit may be set up for forming the logic inverse with respect to an output signal provided by the logic circuit, e.g. in a scenario in which such a logic inverse is intended to be provided for components connected downstream. In the case of three or more data signal inputs, the output signal for the processing device may have, in addition or as an alternative to the at least one inverter, a multiplexer device which processes further one or a plurality of signals generated by the logic circuit arrangement.

The logic circuit arrangement is preferably set up for processing digital data signals and digital logic function signals. However, the circuit arrangement according to the invention may alternatively also be set up for processing analogue signals.

The transistors of the logic circuit arrangement may be connected up for processing two data signals $a_0$, $a_1$ to form an output signal $y(a_0, a_1)$ using the logic function signals $c_0$, $c_1$, $c_2$, $c_3$ for predetermining the logic functions in accordance with the following mapping specification:

$$y = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0$$

and $$\overline{y} = c_0 \cdot \overline{a_1 \cdot a_0} \vee c_1 \cdot \overline{a_1 \cdot \overline{a_0}} \vee c_2 \cdot \overline{\overline{a_1} \cdot a_0} \vee c_3 \cdot \overline{\overline{a_1} \cdot \overline{a_0}}$$

The data signals, the output signal and the logic function signals are preferably digital signals, each of which can assume a logic value "1" or "0".

A bar above a respective variable or constant or a combination thereof means "the logic complement" of the variable or constant or combination.

As an alternative, the transistors of the logic circuit arrangement may be connected up for processing three data signals $a_0$, $a_1$, $a_2$ to form an output signal $y(a_0, a_1, a_2)$ using the logic function signals $c_0$, $c_1$, $c_2$, $c_3$, $c_4$, $c_5$, $c_6$, $c_7$ for predetermining the logic functions in accordance with the following mapping specification:

$$y(a_2, a_1, a_0) = \overline{a_2} \cdot y_0(a_1, a_0) \vee a_2 \cdot y_1(a_1, a_0) \quad (3)$$
where
$$y_0 = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0 \quad (4)$$
and
$$\overline{y_0} = c_0 \cdot \overline{a_1 \cdot a_0} \vee c_1 \cdot \overline{a_1 \cdot \overline{a_0}} \vee c_2 \cdot \overline{\overline{a_1} \cdot a_0} \vee c_3 \cdot \overline{\overline{a_1} \cdot \overline{a_0}} \quad (5)$$
and
$$y_1 = \overline{c_4} \cdot \overline{a_1} \cdot \overline{a_0} \vee \overline{c_5} \cdot \overline{a_1} \cdot a_0 \vee \overline{c_6} \cdot a_1 \cdot \overline{a_0} \vee \overline{c_7} \cdot a_1 \cdot a_0 \quad (6)$$
and
$$\overline{y_1} = c_4 \cdot \overline{a_1 \cdot a_0} \vee c_5 \cdot \overline{a_1 \cdot \overline{a_0}} \vee c_6 \cdot \overline{\overline{a_1} \cdot a_0} \vee c_7 \cdot \overline{\overline{a_1} \cdot \overline{a_0}} \quad (7)$$

In accordance with another alternative, the transistors may be connected up for processing n data signals $a_0$, $a_1, \ldots, a_{n-1}$ to form an output signal $y(a_0, a_1, \ldots, a_{n-1})$ using $2^n$ logic function signals $c_0$, $c_1, \ldots, c_{4(n-1)-1}$ for predetermining the logic functions in accordance with the following mapping specification:

$$y(a_{n-1}, \ldots, a_1, a_0) = \quad (8)$$
$$\overline{a_{n-1}} \ldots \overline{a_2} \cdot y_0 \vee \overline{a_{n-1}} \ldots a_2 \cdot y_1 \vee \ldots \vee a_{n-1} \ldots a_2 \cdot y_{2^{\wedge}(n-2)-1}$$
where
$$y_0 = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0 \quad (9)$$
and
$$\overline{y_0} = c_0 \cdot \overline{a_1 \cdot a_0} \vee c_1 \cdot \overline{a_1 \cdot \overline{a_0}} \vee c_2 \cdot \overline{\overline{a_1} \cdot a_0} \vee c_3 \cdot \overline{\overline{a_1} \cdot \overline{a_0}} \quad (10)$$
and
$$y_1 = \overline{c_4} \cdot \overline{a_1} \cdot \overline{a_0} \vee \overline{c_5} \cdot \overline{a_1} \cdot a_0 \vee \overline{c_6} \cdot a_1 \cdot \overline{a_0} \vee \overline{c_7} \cdot a_1 \cdot a_0 \quad (11)$$
and
$$\overline{y_1} = c_4 \cdot \overline{a_1 \cdot a_0} \vee c_5 \cdot \overline{a_1 \cdot \overline{a_0}} \vee c_6 \cdot \overline{\overline{a_1} \cdot a_0} \vee c_7 \cdot \overline{\overline{a_1} \cdot \overline{a_0}} \quad (12)$$
$\ldots$
and
$$y_{2^{\wedge}(n-2)-1} = \overline{c_{2^{\wedge}n-4}} \cdot \overline{a_1} \cdot \overline{a_0} \vee \quad (13)$$
$$\overline{c_{2^{\wedge}n-3}} \cdot \overline{a_1} \cdot a_0 \vee \overline{c_{2^{\wedge}n-2}} \cdot a_1 \cdot \overline{a_0} \vee \overline{c_{2^{\wedge}n-1}} \cdot a_1 \cdot a_0$$
and
$$\overline{y_{2^{\wedge}(n-2)-1}} = c_{2^{\wedge}n-4} \cdot \overline{a_1 \cdot a_0} \vee \quad (14)$$
$$c_{2^{\wedge}n-3} \cdot \overline{a_1 \cdot \overline{a_0}} \vee c_{2^{\wedge}n-2} \cdot \overline{\overline{a_1} \cdot a_0} \vee c_{2^{\wedge}n-1} \cdot \overline{\overline{a_1} \cdot \overline{a_0}}$$

In accordance with another configuration of the logic circuit arrangement, the transistors may be connected up for processing n data signals $a_0$, $a_1, \ldots, a_{n-1}$ to form an output signal $y(a_0, a_1, \ldots, a_{n-1})$ using logic function signals $c_0$, $c_1 \ldots, c_{2^{\wedge}(n-1)}$, where $c_i \in \{1,0\}$, for predetermining the logic function in accordance with the following mapping specification:

$$y = c_0 \cdot \overline{a_{n-1}} \cdot \ldots \cdot \overline{a_1} \cdot \overline{a_0} \vee \ldots \vee c_{2^{n}-1} \cdot a_{n-1} \cdot \ldots \cdot a_1 \cdot \overline{a_0} \vee$$

$$c_{2^{n}-1} \cdot a_{n-1} \cdot \ldots \cdot a_1 \cdot a_0 \quad (15)$$

Clearly, a logic circuit arrangement realized on a transistor basis using the principle evident from equation (15) constitutes a direct realization of all functions of n inputs or data signals which is free of LUT-based processing. Series paths having a length of (n+1) (n inputs and one configuration transistor) comprising p-MOS or n-MOS transistors occur in this case (analogously to the case of a cell having two inputs).

In order to represent all $2^n$ product terms, $2^n$ series paths are formed in the pull-up path and in the pull-down path and are coupled by a common output $y_{int}$.

By way of example, for the case of four inputs, this means five transistors per series path, sixteen series paths in each case being required for the pull-up path (e.g. first signal path) and for the pull-down path (e.g. second signal path). Consequently—without taking account of transistors for input or output inverters—5*2*16=160 transistors are required in order to realize, with the configuration described, a logic function from all logic functions which combine four data signals with one another.

The transistors of the signal paths may be connected up to one another in such a way that an assigned logic function is unambiguously predetermined solely by means of predetermining the at least one logic function signal. In other words, the selected logic function is preferably unambiguously determined by the values of the potentials at control inputs of the transistors; in particular, the selected logic function is preferably independent of the values of the data signals.

Exemplary embodiments of the invention are illustrated in the figures and are explained in more detail below.

BRIEF DESCRIPTION OF THE DRAWINGS

In the figures:

FIG. 2 shows a table illustrating an assignment between logic function signals and assigned logic functions in accordance with an exemplary embodiment of the invention with two data signals.

Identical or similar components in different figures are provided with identical reference numerals.

Figure 1:
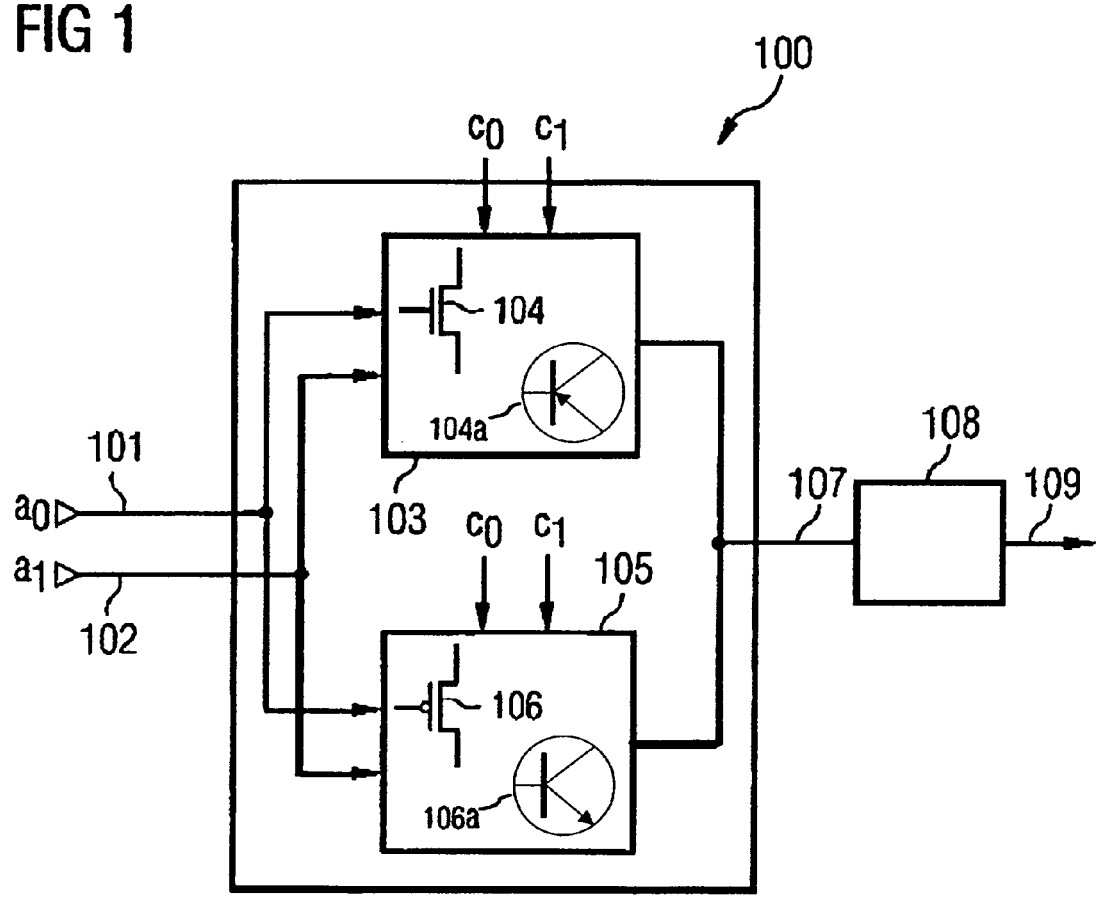
FIG. 1 shows a logic circuit arrangement in accordance with a first exemplary embodiment of the invention.

The illustrations in the figures are schematic and not to scale.

DETAILED DESCRIPTION OF EXEMPLARY EMBODIMENTS OF THE INVENTION

A description is given below, with reference to FIG. 1, of a logic circuit arrangement 100 in accordance with a first exemplary embodiment of the invention.

The logic circuit arrangement 100 has a first data signal input 101 and a second data signal input 102, at which two data signals $a_0$ and $a_1$, respectively, are provided. The logic circuit arrangement 100 contains a first signal path unit 103 coupled to the data signal inputs 101, 102 and having a plurality of n-MOS transistors 104 (n conduction type), the n-MOS transistors 104 being connected up to one another in such a way that they realize a first logic function from a plurality of logic functions for the logic combination of the two data signals $a_0$, $a_1$, so that an output signal representing the result of the first logic function is provided at output 107. Furthermore, the logic circuit arrangement 100 contains a second signal path unit 105 coupled to the data signal inputs 101, 102 and having a plurality of p-MOS transistors 106 (of the p conduction type, which is complementary with respect to the n conduction type). The p-MOS transistors 106 are connected up to one another in such a way that they realize a second logic function from a plurality of different logic functions for the logic combination of the two data signals $a_0$, $a_1$, so that an output signal representing the result of the second logic function is provided at output 107, the result of the second logic function being the inverse of the result of the first logic function. A further processing unit 108 is connected between output 107 and a global output 109, which further processing unit may be coupled to a data input 116 or 117 of a multiplexer 112 connected downstream, by means of which unit output signals can be processed further, for the purpose of providing an output signal y that has been processed further at the global output 109. The output signal y is provided at the global signal output 109 of the logic circuit arrangement 100, which output signal represents the logic combination of the input signals $a_0$, $a_1$ in accordance with the selected logic and has already been subjected to further processing.

As is furthermore shown in FIG. 1, the signal path units 103, 105 are in each case provided with a first logic function signal $c_0$ and a second logic function signal $c_1$. By means of predetermining these logic function signals $c_0$, $c_1$, the transistors 104 and 106 of the signal path unit 103 and 105, respectively, are driven in such a way that the signals $a_0$, $a_1$ are combined with one another by the signal path units 103 and 105 in accordance with the first logic function and the second logic function, respectively. Consequently, a very specific logic function is clearly selected by means of predetermining the logic values of the logic function signals $c_0$, $c_1$.

The logic function signals $c_i$, the data signals $a_i$ and the output signal y can in each case assume either a logic value "1" or a logic value "0".

The theoretical basis founded on Boolean logic which underlies the solution according to the invention is described below.

A Boolean function can be expressed in the canonical conjunctive normal form as an OR combination of the product terms of its n inputs (in FIG. 2 for example n=2 since two input signals $a_1$, $a_0$ are provided). These n inputs are assigned $2^n$ product terms.

Applied to standard CMOS logic, the product terms for the logic value "1" of a function are realized according to the invention as a series path of p-channel transistors (in FIG. 1 for example: p-channel transistors 106). The logic value "0" is correspondingly realized as a series path of n-channel transistors (in FIG. 1: n-MOS transistors 104). Any logic function in accordance with which signals provided at n inputs are logically combined with one another can correspondingly be composed of $2^n$ product terms, clearly by product terms being connected in or disconnected.

For two inputs $a_0$ and $a_1$ (as in FIG. 1), the following holds true:

$$y = k_0 \cdot \overline{a_1} \cdot \overline{a_0} \vee k_1 \cdot \overline{a_1} \cdot a_0 \vee k_2 \cdot a_1 \cdot \overline{a_0} \vee k_3 \cdot a_0 \cdot a_1 \tag{16}$$

$$\overline{y} = k_4 \cdot \overline{a_1} \cdot \overline{a_0} \vee k_5 \cdot \overline{a_1} \cdot \overline{a_0} \vee k_6 \cdot \overline{a_1} \cdot a_0 \vee k_7 \cdot \overline{a_1} \cdot \overline{a_0} \tag{17}$$

where $$k_i = \{0,1\} \text{ where } i=0, 1, \ldots 7 \tag{18}$$

Each function $y=f(a_0, a_1)$ is formed by four values of the switching coefficients or logic function variables $k_0$ to $k_7$ being set to a value of logic "1" and the rest being set to a value of logic "0". Since in CMOS logic the p-channel transistors open with an electrical potential "0" at the control or gate terminal, whereas the n-channel transistors open in the case of an electrical potential having a value "1", the product terms in equations (16), (17) can be ordered to form mutually exclusive pairs. In equations (16), (17), the respective first product terms logically exclude one another, as do the respective second product terms, the respective third product terms and the respective fourth product terms.

The following relationship holds true for the switching coefficients $k_i$:

$$k_0=\overline{k_4}, k_1=\overline{k_5}, k_2=\overline{k_6}, k_3=\overline{k_7} \quad (19)$$

The following results from equations (16), (17), (19) after combination to form four independent switching variables $c_0, c_1, c_2, c_3$:

$$y = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0 \quad (20)$$

$$\overline{y} = c_0 \cdot \overline{a_1 \cdot a_0} \vee c_1 \cdot \overline{a_1 \cdot \overline{a_0}} \vee c_2 \cdot \overline{\overline{a_1} \cdot a_0} \vee c_3 \cdot \overline{\overline{a_1} \cdot \overline{a_0}} \quad (21)$$

where $$c_i = \{0,1\} \text{ where } i=0, 1, \ldots 3 \quad (22)$$

Clearly, equation (20) corresponds to the path of p-MOS transistors 106 in FIG. 1, whereas equation (2) corresponds to the path of n-MOS transistors 104 in FIG. 1.

The logic function for the formation of output signal y is configured in the manner shown in table 200 from FIG. 2. Table 200 shows which associated logic function y can be set or is preset by means of which coefficients $c_i$.

The solution according to the invention is distinguished by increased interference immunity of the circuit and by a very compact realizeability (layout of the logic cell). Furthermore, the solution can be scaled very well with regard to the number of inputs and outputs.

In specific application scenarios, the universal logic cell has, under comparable boundary conditions in comparison with competing solutions, a reduced switching delay in conjunction with a reduced energy consumption.

The invention can be used in the context of FPGA technology or as a combinatorial core cell of a structured ASIC. Furthermore, the invention can be used particularly advantageously wherever the implementation of a subset of logic functions is more complicated than the use of a universal logic cell.

A description is given below, with reference to FIG. 3, of a semiconductor-technological realization of the function in accordance with equations (20), (21), on the basis of transistors.

Figure 3:
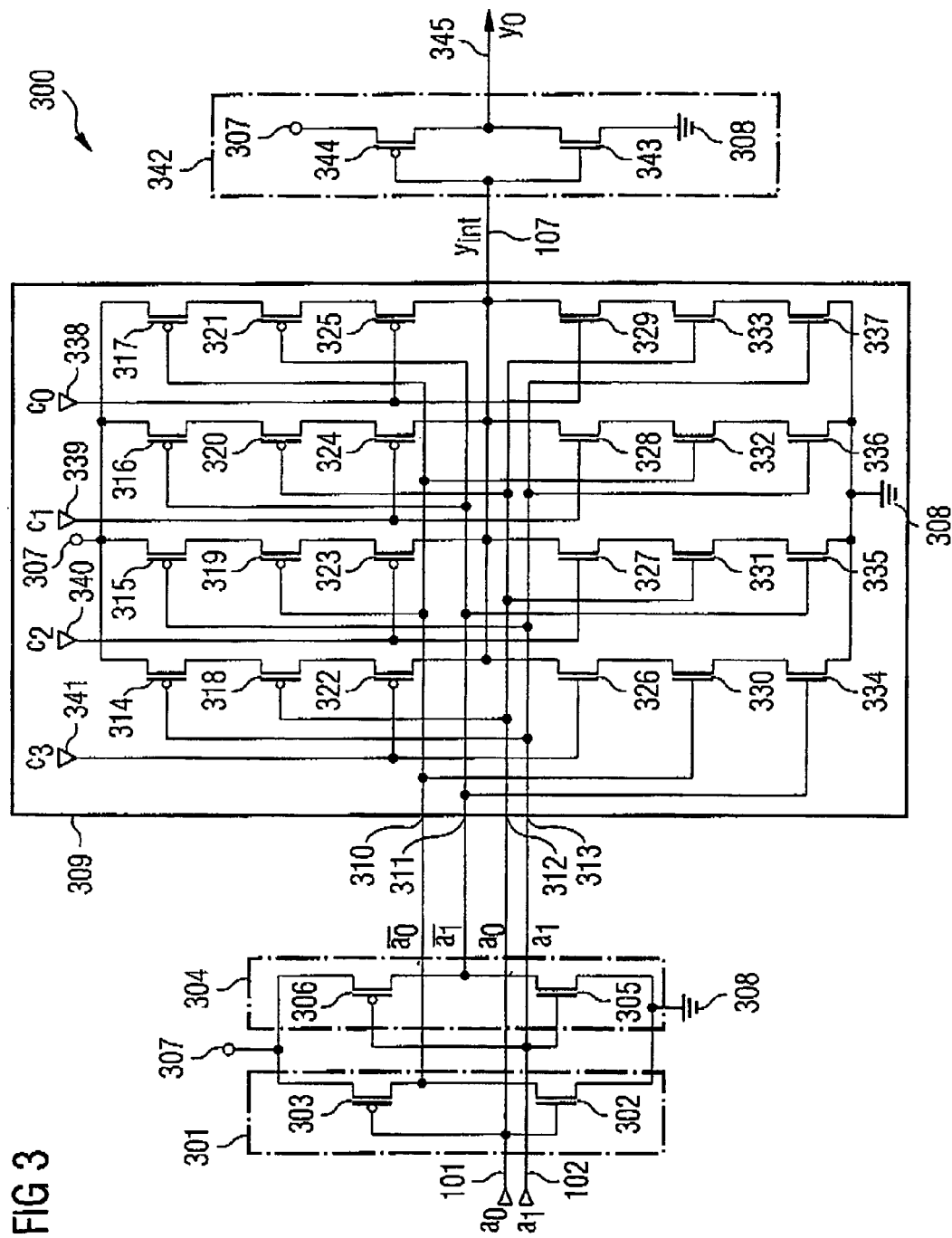
FIG. 3 shows a logic circuit arrangement in accordance with a second exemplary embodiment of the invention.

In the case of the logic circuit arrangement 300 from FIG. 3, a first data signal $a_0$ is provided at a first data signal input 101. Furthermore, a second data signal $a_1$ is provided at a second data signal input 102. The complementary signal $a_o$ with respect to the first data signal $a_0$ is formed from the latter by means of a first inverter circuit 301. The first data signal input 101 is coupled to the gate region of a first n-MOS inverter transistor 302. Furthermore, the first data signal input 101 is coupled to the gate terminal of a first p-MOS inverter transistor 303. A first source/drain region of the first p-MOS inverter transistor 303 is brought to the electrical supply potential 307. The second source/drain region of the first p-MOS inverter transistor 303 is coupled to a first source/drain region of the first n-MOS inverter transistor 302, the second source/drain region of which is brought to the electrical ground potential 308.

Furthermore, a second inverter circuit 304 is provided, by means of which the logically complementary signal $\overline{a_1}$ of the second data signal $a_1$ is formed from the latter. The second data signal input 102 is coupled to the gate terminals of a second n-MOS inverter transistor 305 and of a second p-MOS inverter transistor 306, which transistors 305, 306 form the second inverter circuit 304. A first source/drain region of the second p-MOS inverter transistor 306 is coupled to the first source/drain region of the first p-MOS inverter transistor 303, whereas the second source/drain terminal of the second p-MOS inverter transistor 306 is coupled to a first source/drain terminal of the second n-MOS inverter transistor 305. The second source/drain terminal of the second n-MOS inverter transistor 305 is brought to the electrical ground potential 308.

As shown in FIG. 3, the data signals and their logically complementary values are provided to a signal path unit 309. The signal $a_0$ is provided at a first signal path input 310. The signal $a_1$ is provided at a second signal path input 311. The signal $\overline{a_0}$ is provided at a third signal path input 312. The signal $\overline{a_1}$ is provided at a fourth signal path input 313.

The signal path unit 309 is formed from first to twelfth p-MOS logic transistors 314 to 325 and from first to twelfth n-MOS logic transistors 326 to 337. The first to twelfth p-MOS logic transistors 314 to 325 form a first signal path subunit, whereas the first to twelfth n-MOS logic transistors 326 to 337 form a second signal path subunit.

A first logic function signal $c_0$ is applied to a first logic function input 338. A second logic function signal $c_1$ is provided at a second logic function input 339. A third logic function signal $c_2$ is provided at a third logic function input 340. A fourth logic function signal $c_3$ is provided at a fourth logic function input 341. The logic function inputs 338 to 341 can also be designated as control inputs of the logic circuit arrangement 300.

The fourth logic function input 341 is coupled to the gate terminal of the ninth p-MOS logic transistor 322 and to the gate terminal of the first n-MOS logic transistor 326. The third logic function input 340 is coupled to the gate terminals of the tenth p-MOS logic transistor 323 and of the second n-MOS logic transistor 327. The second logic function input 339 is coupled to the gate terminals of the eleventh p-MOS logic transistor 324 and of the third n-MOS logic transistor 328. The first logic function input 338 is coupled to the gate terminals of the twelfth p-MOS logic transistor 325 and of the fourth n-MOS logic transistor 329.

The first data signal input 310 is coupled to the gate terminal of the fifth n-MOS logic transistor 330, of the sixth p-MOS logic transistor 319, of the seventh n-MOS logic transistor 332 and of the fourth p-MOS logic transistor 317. The second data signal input 311 is coupled to the gate terminals of the ninth n-MOS logic transistor 334, of the tenth n-MOS logic transistor 335, of the third p-MOS logic transistor 316 and of the eighth p-MOS logic transistor 321. The third data signal input 312 is coupled to the gate terminals of the fifth p-MOS logic transistor 318, of the sixth n-MOS logic transistor 331, of the seventh p-MOS logic transistor 320 and of the eighth n-MOS logic transistor 333. The fourth data signal input 313 is coupled to the gate terminals of the first p-MOS logic transistor 314, of the second p-MOS logic transistor 315, of the eleventh n-MOS logic transistor 336 and of the twelfth n-MOS logic transistor 337.

First source/drain terminals of the first to fourth p-MOS logic transistors 314 to 317 are brought to the electrical potential of the supply voltage 307. The second source/drain terminal of the first p-MOS logic transistor 314 is coupled to a first source/drain terminal of the fifth p-MOS logic transistor 318, the second source/drain terminal of which is coupled to a first source/drain terminal of the ninth p-MOS logic transistor 322. The second source/drain terminal of the second p-MOS logic transistor 315 is coupled to a first source/drain terminal of the sixth p-MOS logic transistor 319, the second source/drain terminal of which is coupled to a first source/drain terminal of the tenth p-MOS logic transistor 323. The second source/drain terminal of the third p-MOS logic transistor 316 is coupled to a first source/drain terminal of the seventh p-MOS logic transistor 320, the second source/drain terminal of which is coupled to a first source/drain terminal of the eleventh p-MOS logic transistor 324. The second source/drain terminal of the fourth p-MOS logic transistor 317 is coupled to a first source/drain terminal of the eighth p-MOS logic transistor 321, the second source/drain terminal of which is coupled to a first source/drain terminal of the twelfth p-MOS logic transistor 325.

The second source/drain terminals of the ninth to twelfth p-MOS logic transistors 322 to 325 are coupled to the output 107 and to first source/drain terminals of the first to fourth n-MOS logic transistors 326 to 329. The second source/drain terminal of the first n-MOS logic transistor 326 is coupled to a first source/drain terminal of the fifth n-MOS logic transistor 330, the second source/drain terminal of which is coupled to a first source/drain terminal of the ninth n-MOS logic transistor 334. The second source/drain terminal of the second n-MOS logic transistor 327 is coupled to a first source/drain terminal of the sixth n-MOS logic transistor 331, the second source/drain terminal of which is coupled to a first source/drain terminal of the tenth n-MOS logic transistor 335. The second source/drain terminal of the third n-MOS logic transistor 328 is coupled to a first source/drain terminal of the seventh n-MOS logic transistor 332, the second source/drain terminal of which is coupled to a first source/drain terminal of the eleventh n-MOS logic transistor 336. Furthermore, the second source/drain terminal of the fourth n-MOS logic transistor 329 is coupled to a first source/drain terminal of the eighth n-MOS logic transistor 333, the second source/drain terminal of which is coupled to a first source/drain terminal of the twelfth n-MOS logic transistor 337. The second source/drain terminals of the ninth to twelfth n-MOS logic transistors 334 to 337 are coupled to one another and brought to the electrical ground potential 308.

The output signal $y_{int}$ is provided at the output 107.

The logic inverse $y_0$ is formed from the output signal $y_{int}$ at the output 107 using a third inverter circuit 342, and is provided at a global output 345. The output signal $y_{int}$ is routed through the third inverter circuit 342, formed from a third n-MOS inverter transistor 343 and a third p-MOS inverter transistor 344. The output 107 is coupled to the gate terminals of the transistors 344, 343. A first source/drain terminal of the third p-MOS inverter transistor 344 is brought to the electrical supply potential 307. The second source/drain terminal of the third p-MOS inverter transistor 344 is coupled to a first source/drain terminal of the third n-MOS inverter transistor 343, the second source/drain terminal of which is brought to the electrical ground potential 308. The second source/drain terminal of the third p-MOS inverter transistor 344 and the first source/drain terminal of the third n-MOS inverter transistor 343 are coupled to the global output 345.

The functionality of the logic circuit arrangement 300 is described below.

The signal path unit 309 clearly implements the logic operations with the input signals $\bar{a}_0$, $\bar{a}_1$, $a_0$ and $a_1$. The functionality of equation (20) is clearly implemented by the p-MOS transistors 314 to 325 connected up in the manner shown in FIG. 3, whereas the logic operation in accordance with equation (21) is clearly implemented by the n-MOS transistors 326 to 337. The two inverter circuits 301, 304 are provided between the data signal inputs 101, 102 and the signal path inputs 310 to 313 in order to generate the complementary signals $a_0$, $a_1$. The driving inverter circuit 342 is connected between output 107 and the global output 345. In accordance with the exemplary embodiment described, the cell having two inputs 101, 102 requires thirty transistors, namely the twelve p-MOS logic transistors 314 to 325, the twelve n-MOS logic transistors 326 to 337 and the six transistors 302, 303, 305, 306, 343, 344. The number of configuration bits or logic function signals is four ($c_0$, $c_1$, $c_2$, $c_3$).

It should be noted that, instead of four common logic function signals $c_0$ to $c_3$ it is also possible as an alternative for the twelve p-MOS logic transistors 314 to 325 to be operated with four separate logic function signals and for the twelve n-MOS logic transistors 326 to 337 to be operated with four separate logic function signals that are different from $c_0$ to $c_3$.

The realization which is illustrated with reference to FIG. 3 and relates to two data signals $a_0$, $a_1$ can be implemented arbitrarily for three, four, five, . . . n inputs. However, there is then an increase in the number of transistors arranged in series in a product term. Furthermore, the processing speed of the cell may be reduced on account of an increased capacitive load at $y_{int}$. In unfavourable scenarios, the interference immunity of the cell may be slightly reduced on account of an attenuated edge of $y_{int}$.

A description is given below, with reference to FIG. 4, of a logic circuit arrangement 400 in accordance with a third exemplary embodiment of the invention, which achieves a logic combination with n=3 input signals in conjunction with a high processing speed and particularly good interference immunity.

The logic circuit arrangement 400 has, in addition to the first and second data signal inputs 101, 102, at which the first and second data signals $a_0$, $a_1$ are provided, a third data signal input 401, at which a third data signal $a_2$ is provided. Before the data signals $a_0$, $a_1$ and $a_2$ and also their logic inverses $\bar{a}_0$, $\bar{a}_1$ and $\bar{a}_2$ are coupled into first and second signal path units 405, 406, each of the data signals $a_0$, $a_1$ and $a_2$ passes through a respectively associated inverter circuit 301, 304 and 402 for generating the respective logic inverse. Since, in comparison with FIG. 3, an additional data signal input 401 is provided in FIG. 4, an associated fourth inverter circuit 402 is provided. The third data signal input 401 is coupled to the gate terminals of the fourth n-MOS inverter transistor 403 and of the fourth p-MOS inverter transistor 404. A first source/drain terminal of the fourth p-MOS inverter transistor 404 is brought to the supply potential 307. The second source/drain terminal of the fourth p-MOS inverter transistor 404 is coupled to a first source/drain terminal of the fourth n-MOS inverter transistor 403, the second source/drain terminal of which is brought to the electrical ground potential 308. The second source/drain terminal of the fourth p-MOS inverter transistor 404 and the first source/drain terminal of the fourth n-MOS inverter transistor 403 are coupled to one another and to an input of a multiplexer circuit 409.

Figure 4:
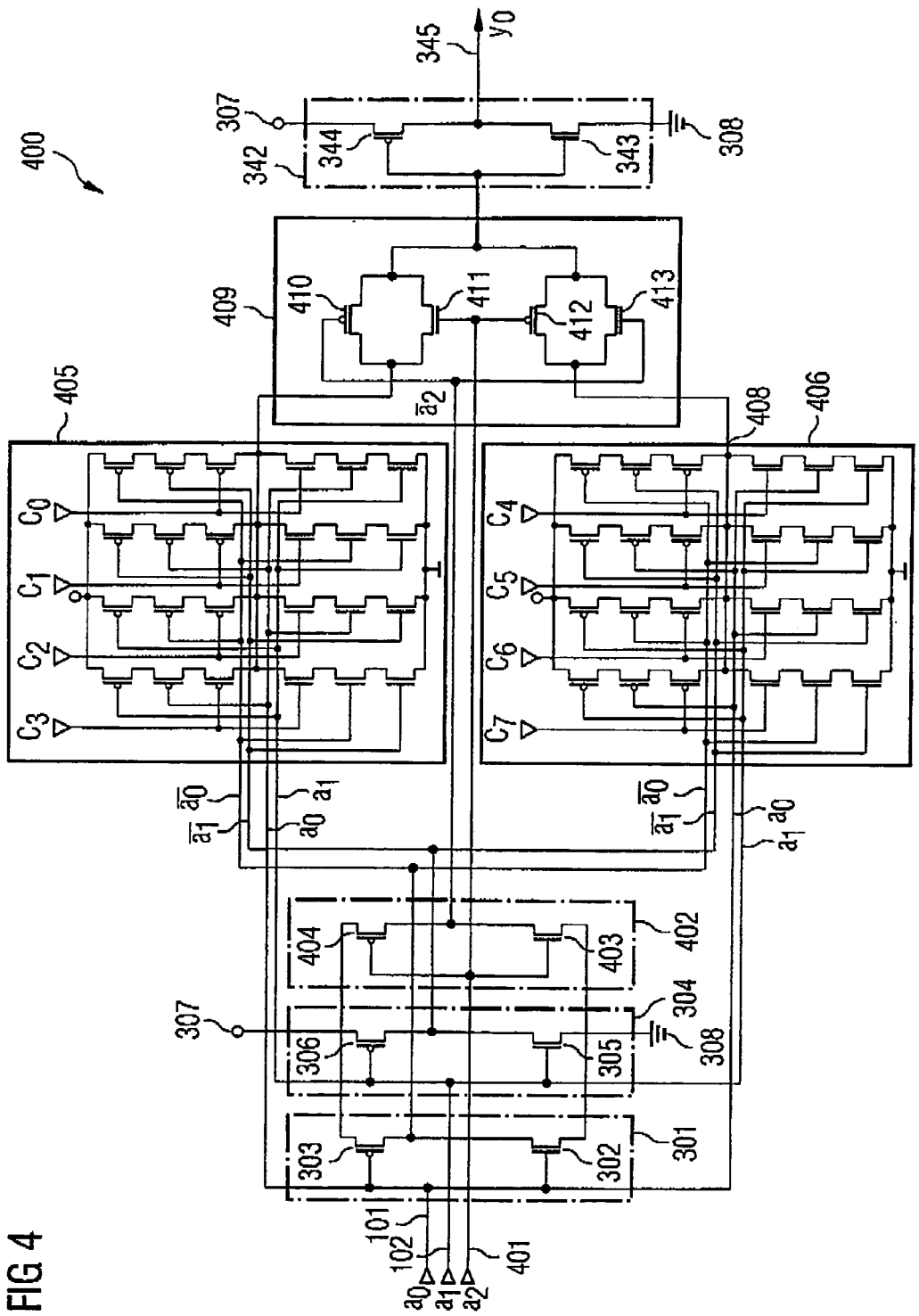
FIG. 4 shows a logic circuit arrangement in accordance with a third exemplary embodiment of the invention.

In the case of the logic circuit arrangement 400 from FIG. 4, the signals $\bar{a}_0$, $\bar{a}_1$, $a_0$ and $a_1$ are coupled into a first signal path unit 405 in the same way as described above with reference to FIG. 3. The construction and the interconnection within the first signal path unit 405 is identical to the construction and the interconnection in the signal path unit 309 from FIG. 3. A specific logic function which is fulfilled by the transistors 314 to 337 of the first signal path unit 405 is predetermined or selected by means of the logic function signals $c_0$ to $c_3$. In accordance with this selected logic function, the signals $a_0$, $a_1$, $\overline{a_0}$ and $\overline{a_1}$ are processed and provided at a first signalpath output 407.

A second signal path unit 406 is identical to the first signal path unit 405 with regard to construction and structure. The data signals $a_0$, $a_1$, $\overline{a_0}$ and $\overline{a_1}$ are once again provided at four signal path inputs of the second signal path unit 406. Said signals are combined with one another by means of a logic function in such a way that a corresponding signal is provided at a second signal path output 408 of the second signal path unit 406. The essential difference between the signal path units 405, 406 consists in the fact that the second signal path unit 406 implements a logic function which is predetermined by means of provision of fifth to eighth logic function signals $c_4$ to $c_7$. In other words, the logic function signals $c_4$ to $c_7$ may be different from the logic function signals $c_0$ to $c_3$ of the first signal path unit 405, so that the logic functions realized by the two signal path units 405, 406 may be different from one another.

As is furthermore shown in FIG. 4, the signal path outputs 407, 408 of the signal path units 405, 406 are coupled to inputs of the multiplexer circuit 409. Consequently, the multiplexer circuit 409 is provided with, as input signals, the data signals $a_2$, $\overline{a_2}$ and also the two output signals of the signal path units 405, 406 (that is to say the results of the signals $a_0$, $\overline{a_1}$, $\overline{a_0}$ and $a_1$ processed in accordance with the logic functions of the signal path units 405, 406) as input signals. These four input signals are processed further by the multiplexer circuit 409. The multiplexer circuit 409 is formed from a first p-MOS multiplexer transistor 410, a first n-MOS multiplexer transistor 411, a second p-MOS multiplexer transistor 412 and a second n-MOS multiplexer transistor 413. The first signal path output 407 is coupled to first source/drain terminals of the first p-MOS multiplexer transistor 410 and of the first n-MOS multiplexer transistor 411. The gate terminal of the first p-MOS multiplexer transistor 410 is coupled to an output of the fourth p-MOS inverter transistor 404. The second signal path output 408 is coupled to first source/drain terminals of the second p-MOS multiplexer transistor 412 and of the second n-MOS multiplexer transistor 413. The third data signal $a_2$ is applied to the gate terminal of the second p-MOS multiplexer transistor 412. The gate terminal of the second p-MOS multiplexer transistor 412 is coupled to the gate terminal of the first n-MOS multiplexer transistor 411. Furthermore, the gate terminal of the second p-MOS multiplexer transistor 413 is coupled to the gate terminal of the first p-MOS multiplexer transistor 410. The second source/drain terminals of the transistors 410 to 413 are coupled to one another and to an input of the third inverter circuit 342.

The functionality of the logic circuit arrangement 400 is described in more detail below.

The interconnection shown in FIG. 4 is based on the following mathematical considerations. In accordance with Boolean algebra, the following holds true:

$$y(a_2,a_1,a_0)=\overline{a_2} \cdot y_0(a_1,a_0) \vee a_2 \cdot y_1(a_1,a_0) \quad (23)$$

$y_0$ is defined in accordance with equation (20) and depends on the variables $c_0$, $c_1$, $c_2$, $c_3$. By contrast, $y_1$ is configured with the additional switching variables or logic function variables $c_4$, $c_5$, $c_6$, $c_7$ and is formed in accordance with the following specification:

$$y_1=\overline{c_4} \cdot \overline{a_1} \cdot \overline{a_0} \vee \overline{c_5} \cdot \overline{a_1} \cdot a_0 \vee \overline{c_6} \cdot a_1 \cdot \overline{a_0} \vee \overline{c_7} \cdot a_1 \cdot a_0 \quad (24)$$

The output signals of the two subfunctions $y_0$ and $y_1$ are brought together by means of the multiplexer circuit 409, which is controlled by means of the data signal $a_2$ (cf. FIG. 4).

It should be noted that the multiplexer circuit 409 can be implemented arbitrarily depending on application requirements, for example using logic gates or n-channel pass gates.

The general formation specification for a universal sale logic function with n inputs reads as follows:

$$y(a_{n-1}, \ldots ,a_1,a_0)=\overline{a_{n-1}} \ldots \overline{a_2} \cdot y_0 \vee \overline{a_{n-1}} \ldots \\ a_2 \cdot y_1 \vee \ldots \vee a_{n-1} \ldots a_2 \cdot y_{2^{(n-2)}-1} \quad (25)$$

The realization of cells where n>3 is effected in a manner similar to that in FIG. 4, in which case the multiplexer circuit 409 may be embodied in two or more stages, for example with a tree structure. The number of required configuration variables is $2^n$.

Another possibility for scaling is based on the clustering of a plurality of simple cells. This clustering or joint arrangement may be effected using a tree structure or using a cascade structure.

A description is given below of how the universal cell according to the invention in the form of the logic circuit arrangement can be used in an FPGA, thereby enabling an interesting alternative to the LUT realization in accordance with the prior art.

The basis of FPGA architecture is a combinatorial logic cell. In practice, in particular those modules whose combinatorics completely provide all logic functions of the inputs prove to be of interest. Logic functions which cannot be realized directly constitute a considerable mapping problem in the FPGA design flow. Among FPGAs with a complete logic function, realizations by means of look-up tables are possible. These architectures gain reconfigurability by virtue of the function values being read from memory or latch cells which can be occupied anew at any time.

The universal logic cell of the logic circuit arrangement 300 or 400 according to the invention can be used as FPGA combinatorics if the configuration variables $c_i$ are written to a memory cell, by way of example. However, the principle of the invention's realization of the combinatorial functions is fundamentally different from that of the look-up table. According to the invention, the logic function is unambiguously defined by the configuration variables $c_i$.

Compared with known architectures (for example XILINX, ACTEL), the universal logic cell of the invention has at least equally good values with regard to time properties and power consumption. However, its outstanding scalability and greater interference immunity are greatly improved compared with the solutions disclosed in the prior art. Gate-based approaches that are sufficiently scaleable and immune to interference are less compact or have a significantly longer delay time.

A particularly interesting field of use for the logic circuit arrangement according to the invention is its use as a universal logic cell as combinatorics in a "structured ASICs" structure.

In connection with the high costs for semiconductor-technological masks, which will rise further in future technology generations, mask-programmed "structured ASICs" are increasingly gaining in importance. This term is understood to mean the approach of providing an ASIC, in a similar manner to an FPGA, with a regular array of cells and interconnect resources. Flexible reconfigurability is dispensable for a "structured ASIC", so that the (logic) function of the cells and the interconnect can be fixedly set according to the design of the chip. In the configuration of a "structured ASIC", a small number of mask planes are sufficient, and ideally a single mask is sufficient. Apart from saving almost all the mask costs, the very regular structure means that effects in the deep submicron range can be better modelled and mastered.

However, these advantages of a "structured ASICs" structure are opposed, in accordance with the prior art, by suboptimal area utilization, a higher power consumption and a low maximum clock frequency compared with custom ASICs based on standard cells.

As combinatorics in a "structured ASIC", the logic circuit arrangement according to the invention amplifies the advantages of a "structured ASIC" structure to a particular degree. Additional advantageous effects can be achieved given suitable implementation. A fixed configuration of such a universal logic cell as a configuration of the logic circuit arrangement according to the invention can be achieved by fixing the switching variables $c_i$ at logic values "0" or "1". In this case, either the product term in the path of the p-MOS transistors is permanently activated and the diametrically opposed product term in the path of the n-MOS transistors is permanently switched off, or vice versa. In any event, the transistors at the switching variables can be saved and replaced by a fixed connection, for example using vias or other conduct-making or short-circuit elements.

A description is given below, with reference to FIG. 5, of a layout plan view of a multilayer arrangement of semiconductor components which can be used for a "structured ASIC" structure of the logic circuit arrangement according to the invention.

Plan view 500 shows individual product terms in accordance with the Boolean function. Furthermore, vias, that is to say electrically conductive connections running perpendicular to the paper plane with respect to FIG. 5, are shown by reference symbols 501. Also shown are a first metal plane 402 and a second metal plane 503, in which are routed lines which are used to realize couplings between the individual structures of the logic circuit arrangement according to the invention.

Figure 5:
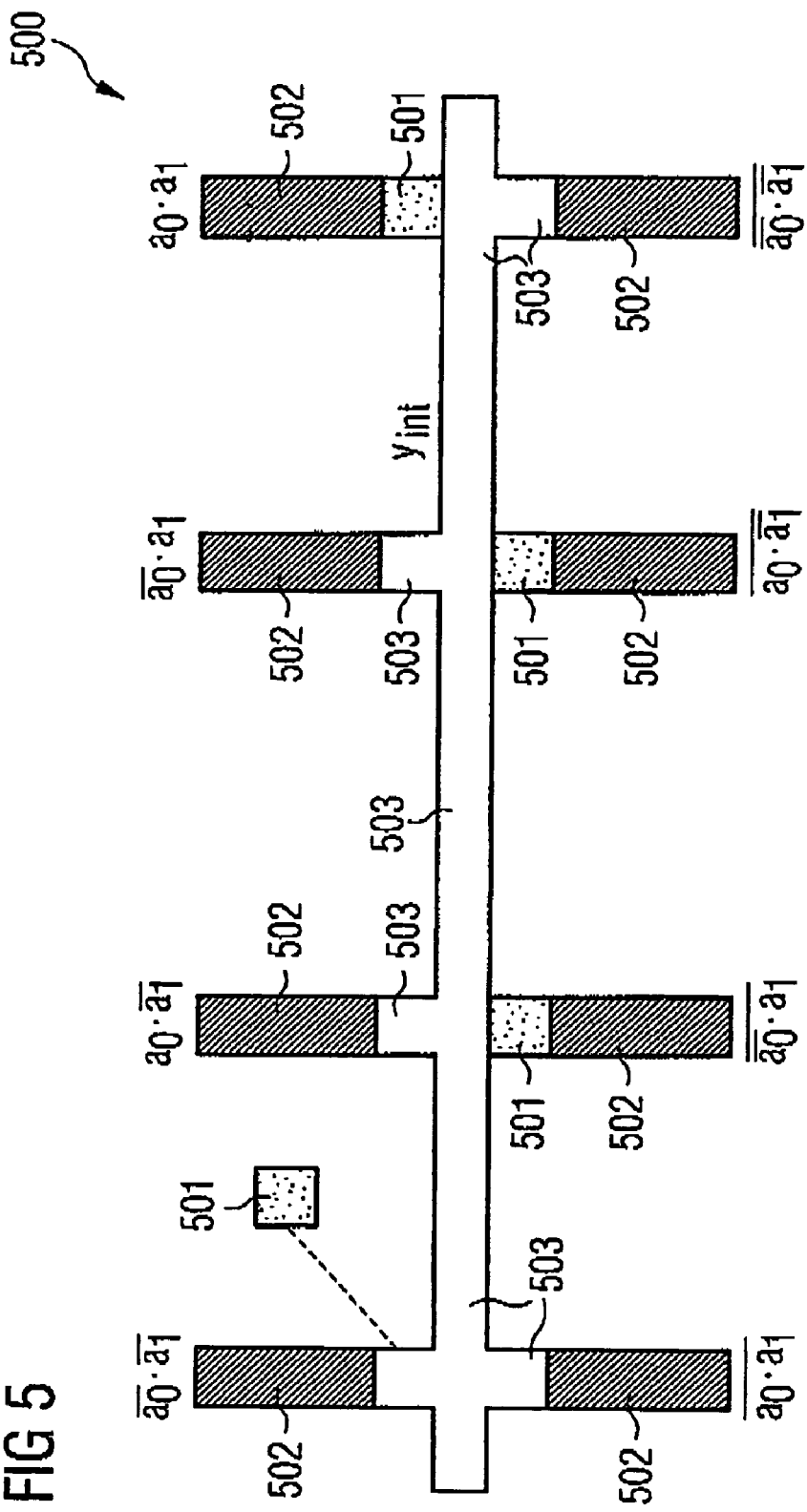
FIG. 5 shows a schematic layout arrangement of interconnects in accordance with an interconnection of the transistors of the logic circuit arrangement according to the invention in accordance with an exemplary embodiment of the invention.

It is possible to achieve the saving of transistors at the switching variables and the replacement thereof by a fixed connection by virtue of the fact that $y_{int}$ is routed in the second metal plane 503 in accordance with FIG. 5. Small bays of the second metal plane 503 overlap leads in the first metal plane 502. The overlaps are preferably essentially of the magnitude of a vias 501.

FIG. 5 clearly reveals the configuration of the configurable universal logic cell, that is to say of the logic circuit arrangement according to the invention, in a "structured ASIC" structure.

Referring to FIG. 5, it should furthermore be noted that respective product terms that are not connected to a via toward $y_{int}$ are also not connected to the supply voltage or to the ground potential. By contrast, activated product terms are in each case connected to the supply voltage or to the ground potential using a via.

Figure 6:
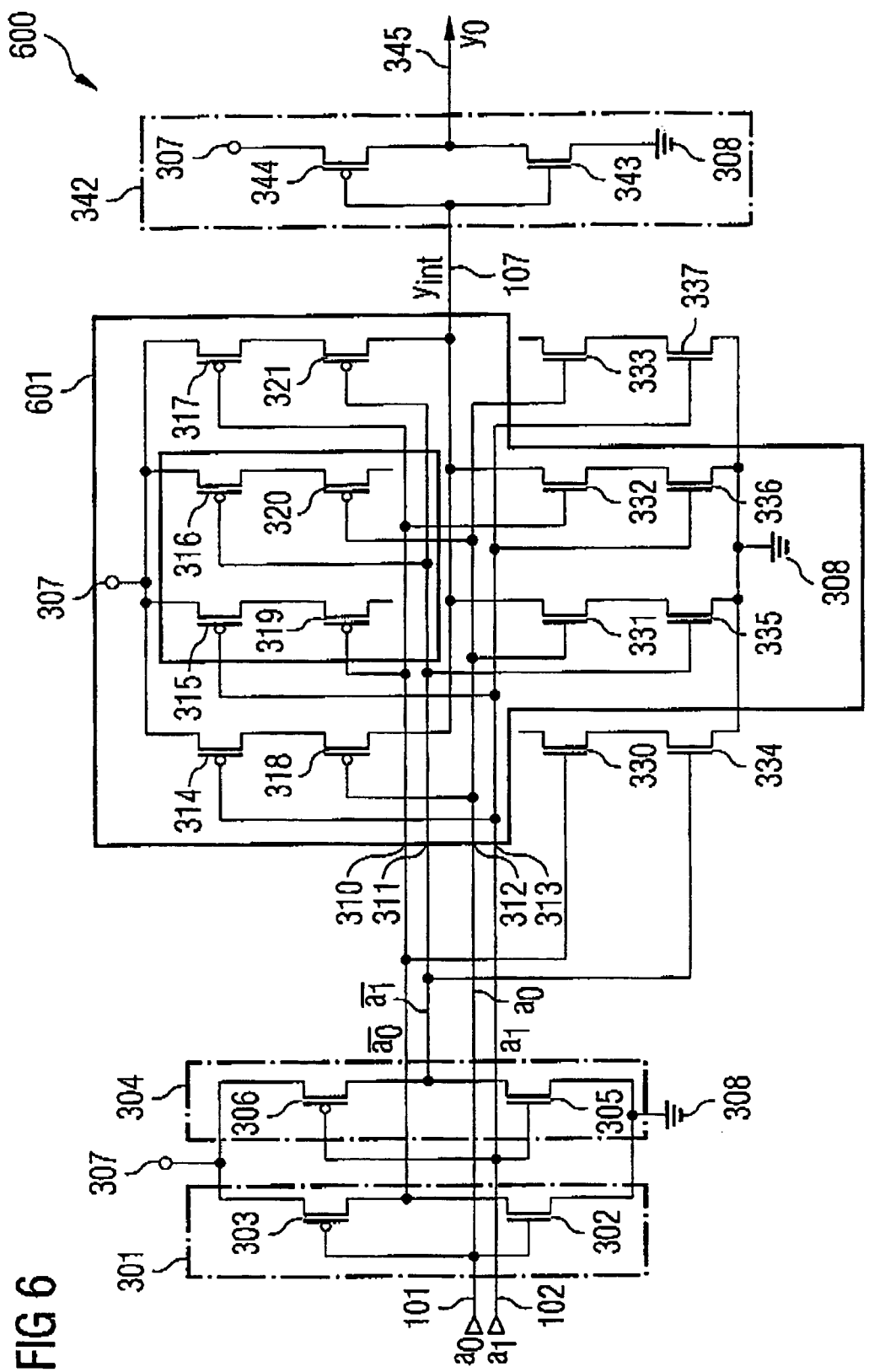
FIG. 6 shows a logic circuit arrangement in accordance with a fourth exemplary embodiment of the invention.

The number of transistors required for realizing the universal logic cell for two inputs $a_0$, $a_1$ decreases in this case from originally thirty (FIG. 3) to twenty-two transistors. This can be seen from FIG. 6, where a logic circuit arrangement 600 is illustrated as a structured ASIC. It is even the case that only fourteen transistors are actively involved in a configurable logic function (an XOR2 gate is shown in FIG. 6), whereas the remaining eight transistors are inactive. The load at $y_{int}$ simultaneously decreases greatly, e.g. to approximately half. Consequently, a short delay time of the cell and a very good realization efficiency can be achieved with the fixedly configured universal logic cell of the invention. In the case of the configuration of the logic circuit arrangement according to the invention as shown in FIG. 6, the provision of variable logic function signals $c_i$ is dispensable and replaced by a hardwired solution.

A description is given below of the construction of the logic circuit arrangement 600 in accordance with a fourth exemplary embodiment of the invention.

The logic circuit arrangement 600 is embodied as a fixedly configured XOR2 gate.

In contrast to the logic circuit arrangement 300, no logic function inputs 338 to 341 are provided in the case of the logic circuit arrangement 600, and it is not necessary to provide any logic function signals. The inverse data signals $\bar{a_0}$, $\bar{a_1}$, are generated in accordance with FIG. 6 as in accordance with FIG. 3 using the first and second inverter subcircuits 301, 304. The further processing of the output signal $y_{int}$ at output 107 is effected in FIG. 6 as in FIG. 3 using the third inverter circuit 342, so that an output signal $y_0$ is provided at a global output 345.

An essential difference between the logic circuit arrangement 300 and the logic circuit arrangement 600 is that some transistors are saved in the case of the signal path unit 601 compared with the signal path unit 309.

The first signal path input 310 is coupled to the gate terminals of the sixth p-MOS logic transistor 319, of the seventh n-MOS logic transistor 332 and of the fourth p-MOS logic transistor 317. The first signal path input 310 is furthermore coupled to the gate terminal of the fifth n-MOS logic transistor 330. The second signal path input 311 is coupled to the gate terminals of the ninth n-MOS logic transistor 334, of the tenth n-MOS logic transistor 335, of the third p-MOS logic transistor 316 and of the eighth p-MOS logic transistor 321. Furthermore, the third signal path input 312 is coupled to the gate terminals of the fifth p-MOS logic transistor 318, of the sixth n-MOS logic transistor 331 and of the seventh p-MOS logic transistor 320. Furthermore, the third signal path input 312 is coupled to the gate terminal of the eighth n-MOS logic transistor 333. The fourth signal path input 313 is coupled to the gate terminals of the first p-MOS logic transistor 314, of the second p-MOS logic transistor 315, of the eleventh n-MOS logic transistor 336 and of the twelfth n-MOS logic transistor 337.

First source/drain terminals of the first to fourth p-MOS logic transistors 314 to 317 are at the potential of the supply voltage 307. The second source/drain terminal of the first p-MOS logic transistor 314 is coupled to the one first source/drain terminal of the fifth p-MOS logic transistor 318, the second source/drain terminal of which is coupled to a first source/drain terminal of the ninth n-MOS logic transistor 322, the second source/drain terminal of which is coupled to the output 107. The second source/drain terminal of the second p-MOS logic transistor 315 is coupled to a first source/drain terminal of the sixth p-MOS logic transistor 319, the second source/drain terminal of which has no coupling. The third p-MOS logic transistor 316 is coupled by its second source/drain region to a first source/drain region of the seventh p-MOS logic transistor 320, the second source/drain region of which has no coupling. The second source/drain region of the fourth p-MOS logic transistor 317 is coupled to a first source/drain region of the eighth p-MOS logic transistor 321, the second source/drain region of which is coupled to the output 107, to the first source/drain region of the sixth n-MOS logic transistor 331 and to a first source/drain region of the seventh n-MOS logic transistor 332.

A first source/drain region of the fifth n-MOS logic transistor 330 has no coupling. The second source/drain region of the fifth n-MOS logic transistor 330 is coupled to a first source/drain region of the ninth n-MOS logic transistor 334, the second source/drain region of which is brought to the electrical ground potential 308. The second source/drain region of the sixth n-MOS logic transistor 331 is coupled to a first source/drain region of the tenth n-MOS logic transistors 335, the second source/drain region of which is brought to the electrical ground potential 308. The second source/drain region of the seventh n-MOS logic transistor 332 is coupled to a first source/drain region of the eleventh n-MOS logic transistor 336, the second source/drain region of which is brought to the electrical ground potential 308. A first source/drain region of the eighth n-MOS logic transistor 333 has no coupling. The second source/drain region of the eighth n-MOS logic transistor 333 is coupled to a first source/drain region of the twelfth n-MOS logic transistor 337, the second source/drain region of which is brought to the electrical ground potential 308.

It should be noted that, in the case of the logic circuit arrangement 600, only the peripheral transistors 302, 303, 305, 306, 343, 344 and also the logic transistors 314, 317, 318, 321, 331, 332, 335 and 336 are functionally active, whereas the remaining transistors shown in FIG. 6 are inactive.

A description is given below, with reference to FIG. 7, of a logic circuit arrangement 700 in accordance with a fifth exemplary embodiment of the invention.

In the case of the logic circuit arrangement 700, first and second data signals $a_0$, $a_1$ are provided at a first data signal input 101 and at a second data signal input 102. After passing through a complementary signal generating unit 702, which may essentially be formed from the first and second inverter circuits 301, 304 connected up in accordance with FIG. 3, apart from the first and second data signals $a_0$, $a_1$, the logically complementary signals thereof are also provided at data signal inputs of a signal path unit 103. In contrast to the logic circuit arrangement 100, in the case of the logic circuit arrangement 700, precisely one signal path unit 103 comprising n-MOS field effect transistors 104 is provided and the signal path unit 105 comprising p-MOS field effect transistors 106 which is shown in FIG. 1 is saved. Logic function signals $c_0$, $c_1$, $c_2$, $c_3$ are provided at four control inputs 702. By means of the logic function signals at the control inputs 702, a predeterminable signal propagation path formed by the transistors 104 is switched, which signal propagation path corresponds to the logic function which is realized. An output signal which represents the processing of the data signals $a_0$, $a_1$ in accordance with the selected logic function is provided at an output of the signal path unit 105, which output is coupled to a first source/drain region of an evaluation transistor 704. Given a corresponding signal at an evaluation input 706 coupled to the gate region of the evaluation transistor 704, the processed output signal is present at an output 107 of the logic circuit arrangement 700, said output being coupled to the second source/drain region of the evaluation transistor 704. The second source/drain region of the evaluation transistor 704 is coupled to a first source/drain region of a precharge transistor 703, the second source/drain region of which is brought to the electrical supply potential 307. Given a corresponding signal at a precharge input 705 coupled to the gate region of the precharge transistor 703, the electrical supply potential 307 is present as reference potential at the output 107 of the logic circuit arrangement 700, said output being coupled to the first source/drain region of the precharge transistor 703.

Figure 7:
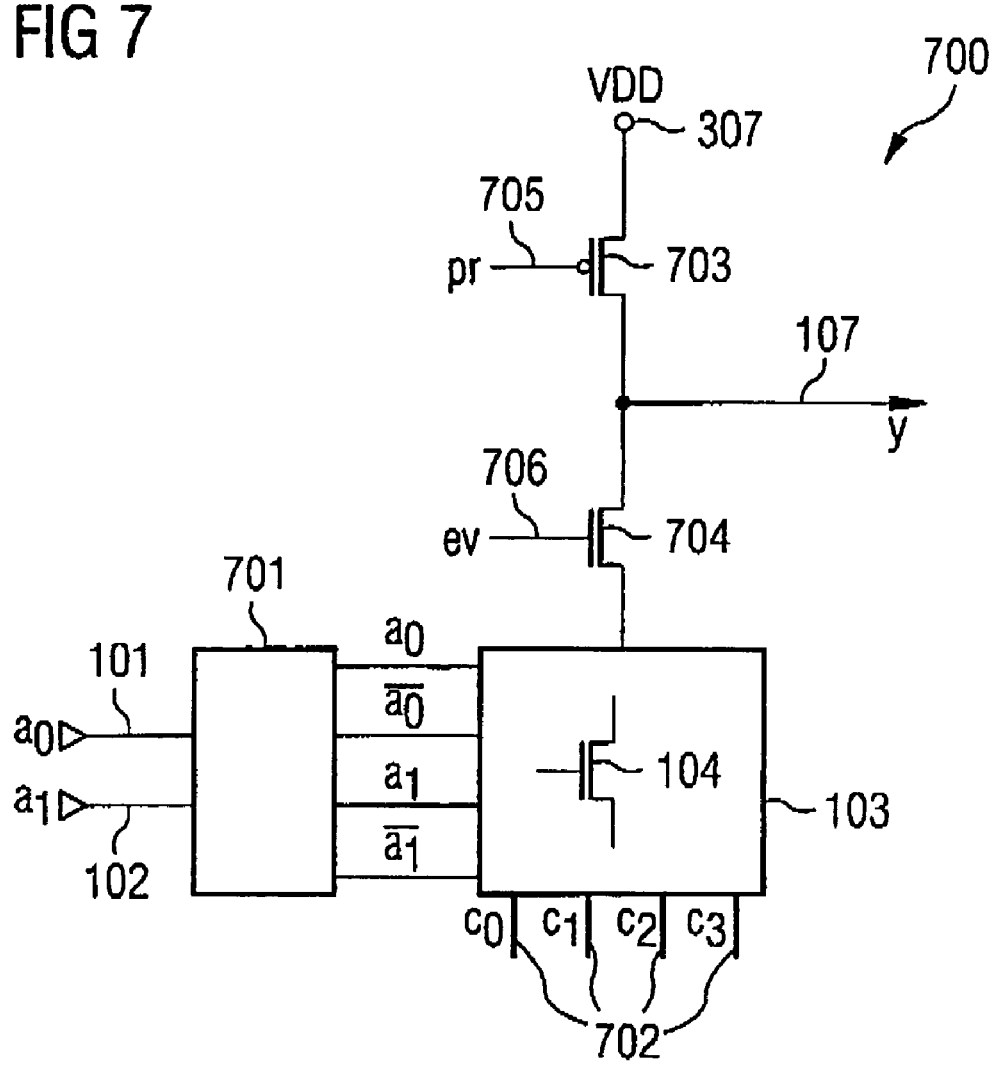
FIG. 7 shows a logic circuit arrangement in accordance with a fifth exemplary embodiment of the invention.

Consequently, compared with FIG. 1, the path comprising p-MOS transistors is saved in FIG. 7. The pull-down network 103 is formed from n-MOS transistors as in FIG. 1, whereas in FIG. 7 the pull-up network 105 comprising p-MOS transistors is saved and is replaced by a statically or dynamically controlled precharge transistor 703. As an alternative, the signal path comprising n-MOS transistors in FIG. 1 may also be saved and replaced by a precharge transistor, the signal path comprising p-MOS transistors being provided in this case.

The invention claimed is:

1. A logic circuit arrangement comprising:
   at least two data signal inputs, at which at least two data input signals are provided;
   a first signal path having a plurality of first transistors of a first conduction type, said signal path being coupled to the data signal inputs, wherein said first transistors are arranged to realize a first logic function selected from the group consisting of a plurality of possible logic functions for the logic combination of the two data input signals, and wherein an output signal representing the result of the first logic function is provided;
   a second signal path having a plurality of second transistors of a second conduction type complementary with respect to the first conduction type, said second signal path being coupled to the data signal inputs, wherein the second transistors are arranged to realize a second logic function selected from the group consisting of a plurality of possible logic functions for the combination of the two data input signals;
   wherein an output signal representing the result of the second logic function is provided, and the result of the second logic function is the inverse of the result of the first logic function; and
   a plurality of control inputs coupled to the first transistors, said plurality of control inputs facilitating activation of a predeterminable signal propagation path, the predeterminable signal propagation path being formed by the first transistors or second transistors and wherein the first plurality of possible logic function and the second plurality of possible logic function define all possible logic functions for the logic combination of the two data input signals.

2. The logic circuit arrangement of claim 1 further comprising:
   an evaluation switch; and
   a precharge switch;
   said switches being connected and controlled wherein, a reference signal is provided at an output of the logic circuit arrangement when the evaluation switch is open and the precharge switch is closed, and wherein the output signal is provided at the output of the logic circuit arrangement when the precharge switch is open and the evaluation switch is closed.

3. The logic circuit arrangement of claim 2, wherein the evaluation switch and the precharge switch each comprise transistors.

4. The logic circuit arrangement of claim 1, wherein at least a portion of transistors selected from the group consisting of first and second transistors are selected from the group consisting of:
   field effect transistors, and
   bipolar transistors.

5. The logic circuit arrangement of claim 1, wherein conduction types are selected from the group consisting of:

the first conduction type being a p conduction type and the second conduction type being an n conduction type, and the first conduction type being an n conduction type and the second conduction type being a p conduction type.

6. The logic circuit arrangement of claim 1, wherein the logic circuit arrangement comprises a CMOS circuit arrangement.

7. The logic circuit arrangement of claim 1, wherein the logic circuit arrangement comprises an application-specific integrated circuit.

8. The logic circuit arrangement of claim 1, wherein the logic circuit arrangement comprises one or more circuit elements selected from the group consisting of:
   programmable logic devices;
   field-programmable gate arrays; and
   mask-programmed application-specific integrated circuits.

9. The logic circuit arrangement of claim 1, wherein the logic functions include one or more of the logic functions selected from the group consisting of:
   an AND combination;
   an OR combination;
   a NAND combination;
   a NOR combination;
   an exclusive-OR combination; and
   an exclusive-NOR combination.

10. The logic circuit arrangement of claim 1, wherein at least one logic function signal for predetermining the first and second logic functions is predetermined in an invariable manner for at least a portion of the first and second transistors at the control inputs.

11. The logic circuit arrangement of claim 10, further comprising a storage device coupled to the at least a portion of the first and second transistors, wherein the values of the at least one logic function signal can be stored.

12. The logic circuit arrangement of claim 1, wherein at least one logic function signal for predetermining the first and second logic functions is predetermined in a variable manner for at least a portion of the transistors.

13. The logic circuit arrangement of claim 1, wherein a device for generating the logically inverse data signal for a given data signal of the at least two data signals is located between the at least two data signal inputs and the first and second signal paths.

14. The logic circuit arrangement of claim 13, wherein the device has an inverter subcircuit for each of the data signals of the at least two data input signals.

15. The logic circuit arrangement of claim 1, wherein a device for further processing of the output signal is connected downstream of the first and second signal paths.

16. The logic circuit arrangement of claim 15, wherein the device for further processing of the output signal is selected from the group consisting of:
   an inverter in a case of at least two data signal inputs; and
   a multiplexer device in a case of three or more data signal inputs.

17. The logic circuit arrangement of claim 1, wherein the logic circuit arrangement is constructed to facilitate processing signals selected from the group consisting of one or more of digital data signals and digital logic function signals.

18. The logic circuit arrangement of claim 1, wherein the first and second transistors are arranged to process two data input signals $a_0$, $a_1$ to form an output signal $y(a_0, a_1)$ using logic function signals $c_0$, $c_1$, $c_2$, $c_3$, wherein $c_i \in \{1,0\}$, and to predetermine the fast and second logic functions in accordance with the following mapping specification:

$$y = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0$$

and $$\overline{y} = c_0 \cdot \overline{\overline{a_1} \cdot \overline{a_0}} \vee c_1 \cdot \overline{\overline{a_1} \cdot a_0} \vee c_2 \cdot \overline{\overline{a_1} \cdot a_0} \vee c_3 \cdot \overline{\overline{a_1} \cdot \overline{a_0}}.$$

19. The logic circuit arrangement of claim 1, wherein the first and second transistors are arranged to process three data input signals $a0$, $a1$, $a2$ to form an output signal $y(a0, a1, a2)$ using logic function signals $c0$, $c1$, $c2$, $c3$, $c4$, $c5$, $c6$, $c7$, wherein $c_i \in \{1,0\}$, and to predetermine the first and second logic functions in accordance with the following mapping specification:

$$y(a_2, a_1, a_0) = \overline{a_2} \cdot y_0 \vee a_2 \cdot y_1$$

where $$y_0 = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0$$

and $$\overline{y_0} = c_0 \cdot \overline{\overline{a_1} \cdot \overline{a_0}} \vee c_1 \cdot \overline{\overline{a_1} \cdot a_0} \vee c_2 \cdot \overline{\overline{a_1} \cdot a_0} \vee c_3 \cdot \overline{\overline{a_1} \cdot \overline{a_0}}$$

and $$y_1 = \overline{c_4} \cdot \overline{a_1} \cdot \overline{a_0} \vee \overline{c_5} \cdot \overline{a_1} \cdot a_0 \vee \overline{c_6} \cdot a_1 \cdot \overline{a_0} \vee \overline{c_7} \cdot a_1 \cdot a_0$$

and $$\overline{y_1} = c_4 \cdot \overline{\overline{a_1} \cdot \overline{a_0}} \vee c_5 \cdot \overline{\overline{a_1} \cdot a_0} \vee c_6 \cdot \overline{\overline{a_1} \cdot a_0} \vee c_7 \cdot \overline{\overline{a_1} \cdot \overline{a_0}}.$$

20. The logic circuit arrangement of claim 1, wherein the first and second transistors are arranged to process n data input signals $a_0, a_1, \ldots, a_{n-1}$ to form an output signal $y(a_0, a_1, \ldots, a_{n-1})$ using $2^n$ logic function signals $c_0, c_1, \ldots c_{2^n-1}$, wherein $c_i \in \{1,0\}$, and to predetermine the first and second logic functions in accordance with the following mapping specification:

$$y(a_{n-1}, \ldots, a_1, a_0) = $$
$$\overline{a_{n-1} \ldots a_2} \cdot y_0 \vee \overline{a_{n-1} \ldots a_2} \cdot y_1 \vee \ldots \vee a_{n-1} \ldots a_2 \cdot y_{2^{\wedge}(n-2)-1}$$

where
$$y_0 = \overline{c_0} \cdot \overline{a_1} \cdot \overline{a_0} \vee \overline{c_1} \cdot \overline{a_1} \cdot a_0 \vee \overline{c_2} \cdot a_1 \cdot \overline{a_0} \vee \overline{c_3} \cdot a_1 \cdot a_0$$
and $$\overline{y_0} = c_0 \cdot \overline{\overline{a_1} \cdot \overline{a_0}} \vee c_1 \cdot \overline{\overline{a_1} \cdot a_0} \vee c_2 \cdot \overline{\overline{a_1} \cdot a_0} \vee c_3 \cdot \overline{\overline{a_1} \cdot \overline{a_0}}$$

and $$y_1 = \overline{c_4} \cdot \overline{a_1} \cdot \overline{a_0} \vee \overline{c_5} \cdot \overline{a_1} \cdot a_0 \vee \overline{c_6} \cdot a_1 \cdot \overline{a_0} \vee \overline{c_7} \cdot a_1 \cdot a_0$$

and $$\overline{y_1} = c_4 \cdot \overline{\overline{a_1} \cdot \overline{a_0}} \vee c_5 \cdot \overline{\overline{a_1} \cdot a_0} \vee c_6 \cdot \overline{\overline{a_1} \cdot a_0} \vee c_7 \cdot \overline{\overline{a_1} \cdot \overline{a_0}}$$

...

and $$y_{2^{\wedge}(n-2)-1} = $$
$$\overline{c_{2^{\wedge}n-4}} \cdot \overline{a_1} \cdot \overline{a_0} \vee \overline{c_{2^{\wedge}n-3}} \cdot \overline{a_1} \cdot a_0 \vee \overline{c_{2^{\wedge}n-2}} \cdot a_1 \cdot \overline{a_0} \vee \overline{c_{2^{\wedge}n-1}} \cdot a_1 \cdot a_0$$

and $$\overline{y_{2^{\wedge}(n-2)-1}} = $$
$$c_{2^{\wedge}n-4} \cdot \overline{\overline{a_1} \cdot \overline{a_0}} \vee c_{2^{\wedge}n-3} \cdot \overline{\overline{a_1} \cdot a_0} \vee c_{2^{\wedge}n-2} \cdot \overline{\overline{a_1} \cdot a_0} \vee c_{2^{\wedge}n-1} \cdot \overline{\overline{a_1} \cdot \overline{a_0}}$$

21. The logic circuit arrangement of claim 1, wherein the first transistors are arranged to process n data input signals $a_0, a_1, \ldots a_{n-1}$ to form an output signal $y(a_0, a_1, \ldots, a_{n-1})$ using logic function signals $c_0, c_1, \ldots, c_{2^{(n-1)}}, \ldots$ wherein $c_i \in \{1,0\}$, and to predetermine the first logic function in accordance with the following mapping specification:

$$y = c_0 \cdot \overline{a_{n-1}} \cdot \ldots \cdot \overline{a_1} \cdot \overline{a_0} \vee \ldots \vee c_{2^n-2} \cdot a_{n-1} \cdot \ldots \cdot a_1 \cdot \overline{a_0} \vee$$

$$c_{2^n-1} \cdot a_{n-1} \cdot \ldots \cdot a_1 \cdot a_0.$$

22. The logic circuit arrangement as claimed in claim 10, wherein the first and second transistors of the signal paths are arranged to facilitate an assigned one of the first and second logic functions being unambiguously predetermined solely by means of predetermining the at least one logic function signal.

* * * * *

UNITED STATES PATENT AND TRADEMARK OFFICE
CERTIFICATE OF CORRECTION

PATENT NO.       : 7,199,618 B2
APPLICATION NO.  : 10/996620
DATED            : April 3, 2007
INVENTOR(S)      : Jorg Gliese et al.

It is certified that error appears in the above-identified patent and that said Letters Patent is hereby corrected as shown below:

In the Specification:

At column 12, lines 11-13, "The signal $\bar{a}_0$ is provided at a first signal path input 310. The signal $\bar{a}_1$ is provided at a second signal path input 311. The signal $a_0$ is provided at a third signal path input 312. The" should read --The signal $\bar{a}_0$ is provided at a first signal path input 310. The signal $\bar{a}_1$ is provided at a second signal path input 311. The signal $a_0$ is provided at a third signal path input 312. The--

At column 13, line 60, "signals $a_0$, $a_1$, $a_0$ and" should read --signals $\bar{a}_0$, $\bar{a}_1$, $a_0$ and--

At column 14, line 1, "signals $a_0$, $a_1$" should read --signals $\bar{a}_0$, $\bar{a}_1$--

At column 15, line 6, "signals $a_0$, $a_1$, $a_0$ and" should read --signals $\bar{a}_0$, $\bar{a}_1$, $a_0$ and--

At column 15, line 24, "signals $a_2$, $a_2$" should read --signals $\bar{a}_2$, $a_2$--

At column 18, line 17, "$a_0$, $\bar{a}_1$, are" should read -- $\bar{a}_0$, $\bar{a}_1$, are--

In the Claims:

In Claim 18, Applicants made the following error to be corrected:

Column 21, line 66, "fast" should read --first--.

UNITED STATES PATENT AND TRADEMARK OFFICE
CERTIFICATE OF CORRECTION

PATENT NO. : 7,199,618 B2
APPLICATION NO. : 10/996620
DATED : April 3, 2007
INVENTOR(S) : Jorg Gliese et al.

It is certified that error appears in the above-identified patent and that said Letters Patent is hereby corrected as shown below:

In the Claims (cont'd):

In Claim 19, the PTO made the following error to be corrected:

Column 22, line 13, "ciε{1,0}" should read --$c_i\varepsilon$ {1,0}--.

Signed and Sealed this

Tenth Day of July, 2007

JON W. DUDAS
*Director of the United States Patent and Trademark Office*